United States Patent
Marrani et al.

(10) Patent No.: US 11,629,249 B2
(45) Date of Patent: Apr. 18, 2023

(54) VINYLIDENE FLUORIDE AND TRIFLUOROETHYLENE CONTAINING POLYMERS LATEXES

(71) Applicant: SOLVAY SPECIALTY POLYMERS ITALY S.P.A., Bollate (IT)

(72) Inventors: Alessio Marrani, Lecco (IT); Ivan Falco, Sedriano (IT); Valeriy Kapelyushko, Alessandria (IT)

(73) Assignee: SOLVAY SPECIALTY POLYMERS ITALY S.P.A., Bollate (IT)

( * ) Notice: Subject to any disclaimer, the term of this patent is extended or adjusted under 35 U.S.C. 154(b) by 49 days.

(21) Appl. No.: 16/340,050

(22) PCT Filed: Sep. 29, 2017

(86) PCT No.: PCT/EP2017/074767
§ 371 (c)(1),
(2) Date: Apr. 5, 2019

(87) PCT Pub. No.: WO2018/065306
PCT Pub. Date: Apr. 12, 2018

(65) Prior Publication Data
US 2020/0040174 A1    Feb. 6, 2020

(30) Foreign Application Priority Data

Oct. 5, 2016 (EP) .................... 16192408

(51) Int. Cl.
| | | |
|---|---|---|
| C08L 27/16 | (2006.01) | |
| C08F 214/22 | (2006.01) | |
| H01B 3/44 | (2006.01) | |
| H01G 7/06 | (2006.01) | |
| H01L 49/02 | (2006.01) | |
| H01L 37/02 | (2006.01) | |
| H01L 41/193 | (2006.01) | |

(52) U.S. Cl.
CPC ............ *C08L 27/16* (2013.01); *C08F 214/22* (2013.01); *C08F 214/225* (2013.01); *C08F 2800/10* (2013.01); *C08L 2201/52* (2013.01); *H01B 3/445* (2013.01); *H01G 7/06* (2013.01); *H01L 28/40* (2013.01); *H01L 37/025* (2013.01); *H01L 41/193* (2013.01)

(58) Field of Classification Search
CPC ........ C08L 27/16; C08F 14/18; C08F 214/20; C08F 114/22; C08F 2/22
See application file for complete search history.

(56) References Cited

U.S. PATENT DOCUMENTS

| | | |
|---|---|---|
| 4,173,033 A | 10/1979 | Sako et al. |
| 4,611,260 A | 9/1986 | Bauer |
| 4,684,337 A | 8/1987 | Bauer |
| 4,708,989 A | 11/1987 | Broussoux et al. |
| 4,778,867 A | 10/1988 | Preis |
| 4,784,915 A | 11/1988 | Sakagami et al. |
| 6,255,520 B1 | 7/2001 | Lannuzel et al. |
| 7,122,608 B1 | 10/2006 | Brinati et al. |
| 2011/0082271 A1* | 4/2011 | Brinati .................. H01L 37/025 526/209 |
| 2011/0160415 A1 | 6/2011 | Marchionni et al. |
| 2012/0283382 A1 | 11/2012 | Spada et al. |

FOREIGN PATENT DOCUMENTS

| | | |
|---|---|---|
| EP | 0508802 A1 | 10/1992 |
| EP | 2133370 A1 | 12/2009 |

OTHER PUBLICATIONS

Bauer F. et al., "Very high pressure behaviour of precisely-poled PVDF", Ferroelectrics, 1995, vol. 171, p. 95-102—OPA, Amsterdam.
Isner-Brom P. et al., "Intrinsic piezoelectric characterization of PVDF copolymers : determination of elastic constants", Ferroelectrics, 1995, vol. 171, p. 271-279—OPA, Amsterdam.
Standard ASTM D3418-08, "Standard Test Method for Transition Temperatures and Enthalpies of Fusion and Crystallization of Polymers by Differential Scanning Calorimetry", 2008, p. 1-7.
Standard ASTM D1238-04, "Standard Test Method for Melt Flow Rates of Thermoplastics by Extrusion Plastometer", 2004, p. 1-13.

* cited by examiner

*Primary Examiner* — Gregory Listvoyb
(74) *Attorney, Agent, or Firm* — Osha Bergman Watanabe & Burton LLP

(57) ABSTRACT

The invention provides novel latexes of particles of vinylidene fluoride/trifluoroethylene copolymers possessing a more ordered ferroelectric crystalline phase, and hence improved ferro-, pyro-, and piezo-electric properties, and a method for manufacturing the same by emulsion polymerization in the presence of certain cyclic fluorosurfactants.

7 Claims, 1 Drawing Sheet

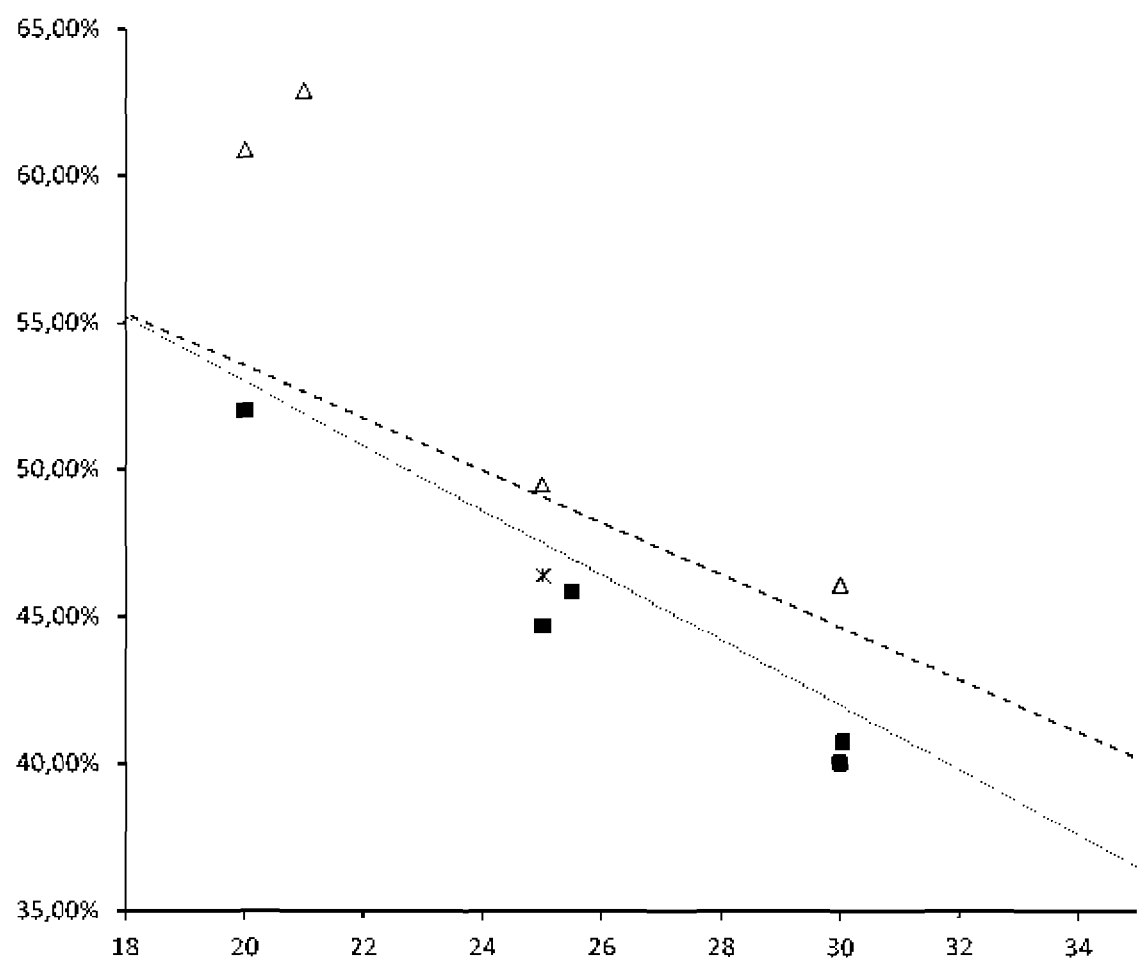

VINYLIDENE FLUORIDE AND TRIFLUOROETHYLENE CONTAINING POLYMERS LATEXES

CROSS-REFERENCE TO RELATED APPLICATION

This application is a U.S. national stage entry under 35 U.S.C. 071 of International Application No. PCT/EP2017/074767 filed Sep. 29, 2017, which claims priority to European application No. 16192408.9 filed Oct. 5, 2016. The entire contents of these applications are explicitly incorporated herein by this reference.

TECHNICAL FIELD

The invention pertains to novel latexes of copolymers of vinylidene fluoride and trifluoroethylene having improved ferroelectric properties, to a process for their manufacture in aqueous emulsion in the presence of a specific fluorinated emulsifier, and to their use as piezoelectric, ferroelectric, dielectric or pyroelectric materials in electric/electronic devices.

BACKGROUND ART

It is well known that copolymers of vinylidene fluoride and trifluoroethylene are employed and are being developed for use in electric/electronic devices (e.g. transducers, sensors, actuators, ferroelectric memories, capacitors) because of their ferroelectric, piezoelectric, pyroelectric and dielectric behaviour/properties, piezoelectric behaviour being particularly used.

As is well known, the term piezoelectric means the ability of a material to exchange electrical for mechanical energy and vice versa and the electromechanical response is believed to be essentially associated with dimensional changes during deformation or pressure oscillation. The piezoelectric effect is reversible in that materials exhibiting the direct piezoelectric effect (the production of electricity when stress is applied) also exhibit the converse piezoelectric effect (the production of stress and/or strain when an electric field is applied).

Ferroelectricity is the property of a material whereby this latter exhibits a spontaneous electric polarization, the direction of which can be switched between equivalent states by the application of an external electric field Pyroelectricity is the ability of certain materials to generate an electrical potential upon heating or cooling. Actually, as a result of this change in temperature, positive and negative charges move to opposite ends through migration (i.e. the material becomes polarized) and hence, an electrical potential is established.

It is generally understood that piezo-, pyro-, ferro-electricity in copolymers of vinylidene fluoride and trifluoroethylene is related to a particular crystalline habit, so called ferroelectric-phase or beta-phase, wherein hydrogen and fluorine atoms are arranged to give maximum dipole moment per unit cell.

Said VDF-TrFE copolymers are well known in the art and are notably described in U.S. Pat. No. 4,778,867 (PRIES SEYMOUR (US)) Oct. 18, 1988, U.S. Pat. No. 4,708,989 (THOMSON CSF (FR)) Nov. 24, 1987, U.S. Pat. No. 4,784,915 (KUREHA CHEMICAL IND CO LTD (JP)) Nov. 15, 1988, U.S. Pat. No. 4,173,033 (DAIKIN IND LTD (JP)) Oct. 30, 1979.

Generally speaking, techniques for manufacturing these VDF-TrFE copolymers may be based on suspension polymerization, i.e. in conditions of temperature and pressure such that VDF is present in supercritical phase, using organic initiators in aqueous phase, and producing a slurry of coarse particles which precipitate from aqueous polymerization medium as soon as produced. Nevertheless, suspension polymerization technologies are quite burdensome to handle at industrial level, because of the high pressures employed, and because of the safety concerns hence associated to the handling in such harsh conditions of TrFE, possibly undergoing explosive behaviour As TrFE has been recognized to be endowed with deflagration/explosion behaviour similar to tetrafluoroethylene (TFE), opportunity of limiting polymerization pressure represents a significant advantage in safety management.

Hence, techniques based on aqueous-based emulsion polymerization have been explored, as they enable producing in more mild conditions, yet at high throughput rate, stable dispersions of VDF-TrFE polymer particles, with less environmental concerns, at limited trifluoroethylene (TrFE) partial pressure and overall pressure.

Moreover, access to latexes of VDF-TrFE polymer enables opening processing/transformation opportunities to coating/casting techniques based on solvent-free approaches, which are attracting more and more attention in this area.

However, VDF-TrFE copolymers obtained from latexes produced by aqueous emulsion polymerization processes of the prior art suffer from certain drawbacks, including notably less valuable piezo-, pyro-, ferro-electric performances, when compared to e.g. suspension-polymerized VDF-TrFE copolymers.

Now, optimization of piezoelectric, pyroelectric or ferroelectric effect requires thermodynamic order of the ferroelectric phase to be maximized, so as to have more structured crystalline domain delivering improved piezo-, pyro-, ferro-electric performances, which is in conflict with the results obtained through emulsion polymerization.

On the other side, emulsion polymerization techniques using certain cyclic fluorinated surfactants for the polyaddition polymerization of fluorinated monomers are known.

US 2011160415 (SOLVAY SOLEXIS SPA) Jun. 30, 2011 pertains to a method for making a fluoropolymer comprising an aqueous emulsion polymerization of one or more fluorinated monomers wherein said aqueous emulsion polymerization is carried out in the presence of at least one cyclic fluorocompound of the following formula (I):

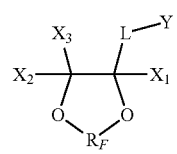

(I)

wherein $X_1$, $X_2$, $X_3$, equal to or different from each other are independently selected from the group consisting of H, F, and $C_{1-6}$ (per)fluoroalkyl groups, optionally comprising one or more catenary or non-catenary oxygen atoms; L represents a bond or a divalent group; $R_F$ is a divalent fluorinated $C_{1-3}$ bridging group; Y is a hydrophilic function selected from the group consisting of anionic functionalities, cationic functionalities, and non-ionic functionalities. Examples of fluorinated monomers that may be polymerized using the cyclic fluorocompound according to formula (I) as an emulsifier include partially or fully fluorinated gaseous monomers including fluorinated olefins such as tetrafluoroethylene (TFE), chlorotrifluoroethylene (CTFE), hexafluoropropylene (HFP), vinyl fluoride (VF), vinylidene fluoride (VDF), partially or fully fluorinated allyl ethers and partially or fully fluorinated alkyl or alkoxy-vinyl ethers.

Further, US 2012283382 (SOLVAY SPECIALTY POLYMERS ITALY S.P.A.) Nov. 8, 2012 pertains to a process for manufacturing a dispersions of a vinylidene fluoride (VDF) thermoplastic polymer, said process comprising polymerizing VDF in an aqueous phase comprising: at least one surfactant selected from the group consisting of non-fluorinated surfactants and fluorinated surfactants having a molecular weight of less than 400; and at least one functional (per)fluoropolyether comprising at least one (per)fluoropolyoxyalkylene chain and at least one functional group. The vinylidene fluoride polymer is generally a polymer consisting of (a') at least 60 percent by moles, preferably at least 75 percent by moles, more preferably 85 percent by moles of vinylidene fluoride (VDF); (b') optionally from 0.1 to 15 percent, preferably from 0.1 to 12 percent, more preferably from 0.1 to 10 percent by moles of a fluorinated monomer different from VDF; said fluorinate monomer being preferably selected in the group consisting of vinylfluoride (VF), chlorotrifluoroethylene (CTFE), hexafluoropropene (HFP), tetrafluoroethylene (TFE), perfluoromethylvinylether (MVE), trifluoroethylene (TrFE) and mixtures therefrom, including notably homopolymers of VDF, VDF/TFE copolymer, VDF/TFE/HFP copolymers, VDF/TFE/CTFE copolymers, VDF/TFE/TrFE copolymers, VDF/CTFE copolymers, VDF/HFP copolymers, VDF/TFE/HFP/CTFE copolymers. The fluorinated surfactant with low molecular weight may be a surfactant complying with formula:

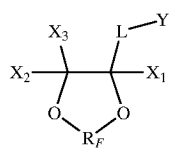

(I)

wherein: $X_1$, $X_2$ and $X_3$, equal to or different from each other, are independently selected from the group consisting of H, F and $C_1$-$C_6$ (per)fluoroalkyl groups, optionally comprising one or more catenary or non-catenary oxygen atoms, $R_F$ represents a divalent perfluorinated $C_1$-$C_3$ bridging group, L represents a bond or a divalent group and Y represents an anionic functionality.

There is thus still a need in the art for VDF-TrFE materials manufactured by emulsion polymerization in smooth conditions, and which yet possess improved piezo-, pyro-, ferro-electric performances.

Now, the invention described herein provides a material and a method which satisfy these needs.

SUMMARY OF INVENTION

The invention thus provides an aqueous latex comprising particles of a polymer [polymer (F)] comprising:
recurring units derived from vinylidene fluoride (VDF) in an amount of at least 60% moles, with respect to the total moles of recurring units;

recurring units trifluoroethylene (TrFE) in an amount of at least 18% moles, with respect to the total moles of recurring units, and optionally recurring units derived from at least one additional monomer different from VDF and TrFE, said polymer (F) possessing thermodynamic ordered structure in the ferroelectric phase, such that the relation between:
(i) the parameter Xc (%) defined as follows:

$$Xc\ (\%) = \frac{\Delta H_c}{(\Delta H_m + \Delta H_c)} \times 100$$

wherein $\Delta H_c$ is the enthalpy associated to the Curie transition between ferroelectric and paraeletric phase, as determined in J/g by DSC technique on second heating scan, at a ramp rate of 10° C., and $\Delta H_m$ is the enthalpy of melting, as determined in J/g according to ASTM D3418; and
(ii) the content in recurring units different from VDF expressed in % moles, with respect to the total moles of recurring units, designated as CM (% moles), satisfies the following inequality:

$$Xc\ (\%) \geq a \cdot CM\ (\%\ \text{moles}) + b$$

wherein a=−1.10 and b=75.00, preferably satisfies the inequality:

$$Xc\ (\%) \geq a' \cdot CM\ (\%\ \text{moles}) + b'$$

wherein a'=−0.89 and b'=71.33.

The invention further pertains to a method for making a latex as above detailed, said method comprising polymerizing vinylidene fluoride (VDF), trifluoroethylene (TrFE), and optionally at least one additional monomer different from VDF and TrFE in an aqueous emulsion in the presence of a radical initiator and of a fluorinated surfactant [surfactant (C)] complying with formula (I):

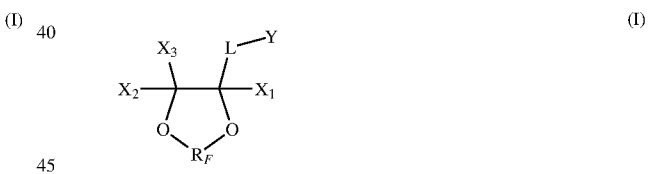

(I)

wherein $X_1$, $X_2$, $X_3$, equal or different from each other are independently selected among H, F, and $C_{1-6}$ (per)fluoroalkyl groups, optionally comprising one or more catenary or non-catenary oxygen atoms; L represents a bond or a divalent group; $R_F$ is a divalent fluorinated $C_{1-3}$ bridging group; Y is an anionic functionality.

The Applicant has surprisingly found that the method as above detailed enables accessing in smooth conditions and high throughput, in particular at relatively lower TrFE partial pressure and total pressure, latexes of VDF-TrFE possessing improved piezo-, pyro-, ferro-electric performances, as a consequence of their improved structural/conformational order in their ferro-electric phase, as measured using the Xc (%) parameter, as defined above.

BRIEF DESCRIPTION OF DRAWINGS

FIG. 1 is a plot of the parameter Xc (%), hereunder referred also as crystallinity order parameter, as a function of the comonomer content (in % moles) for lattices of polymer (F); L are representative of embodiment's according to the invention, obtained from emulsion polymerization in the presence of the cyclic surfactant (I) and an radical initiator; ■ and * are representative of non-working embodiment's and more precisely ■ refer to latexes obtained from emulsion polymerization in the presence of a different fluorosurfactant and an organic initiator, while * refers to a latex obtained from emulsion polymerization in the presence of a different fluorosurfactant and an inorganic initiator. Dotted lines represents the inequalities the inequality:

Xc (%)≥a·CM (% moles)+b wherein a=−1.10 and b=75.00, and the inequality:

Xc (%)≥a'·CM (% moles)+b' wherein a'=−0.89 and b'=71.33.

DISCLOSURE OF INVENTION

Polymer (F) of the invention generally comprises 18 to 40% by moles preferably from 20 to 35% moles of recurring units derived from TrFE.

Polymer (F) of the invention may further comprise recurring units derived from one or more than one fluoromonomers other than VDF and TrFE, such as notably hexafluoropropylene, tetrafluoroethylene, chlorotrifluoroethylene, or recurring units derived from one or more than one non-fluorinated monomers, such as notably (meth)acrylic monomers, and more specifically, recurring units derived from at least one hydrophilic (meth)acrylic monomer (MA) of formula:

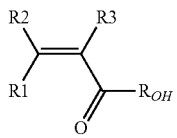

wherein each of R1, R2, R3, equal or different from each other, is independently an hydrogen atom or a $C_1$-$C_3$ hydrocarbon group, and ROH is a hydroxyl group or a $C_1$-$C_5$ hydrocarbon moiety comprising at least one hydroxyl group.

Non limitative examples of hydrophilic (meth)acrylic monomers (MA) are notably acrylic acid, methacrylic acid, hydroxyethyl (meth)acrylate, hydroxypropyl(meth)acrylate; hydroxyethylhexyl(meth)acrylates.

The monomer (MA) is more preferably selected among: hydroxyethylacrylate (HEA) of formula:

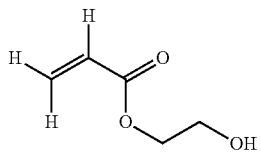

2-hydroxypropyl acrylate (HPA) of either of formulae:

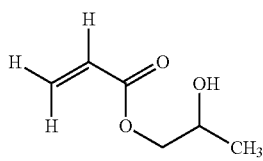

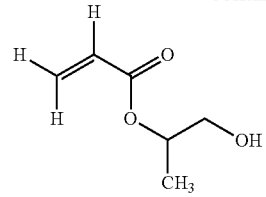

acrylic acid (AA) of formula:

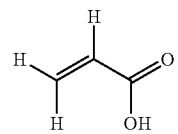

and mixtures thereof.

Polymer advantageously comprises:
recurring units derived from vinylidene fluoride (VDF) in an amount of from 60% to 81% moles, with respect to the total moles of recurring units;
recurring units trifluoroethylene (TrFE) in an amount of from 18% to 39% moles, with respect to the total moles of recurring units, and
optionally recurring units derived from at least one additional monomer different from VDF and TrFE, in an amount of 0 to 5% moles.

Nevertheless, polymer consisting essentially of recurring units derived from VDF and TrFE are generally preferred.

Such polymers typically consists essentially of:
from 18 to 35% by moles preferably from 20 to 32% moles of recurring units derived from TrFE; and
from 65 to 82% moles, preferably from 68 to 80% moles of recurring units derived from VDF.

Melt flow index (MFI) of the polymer (F) will be selected by the skilled in the art in relation to the processing technology chosen for obtaining final parts (e.g. films or sheets).

It is nevertheless generally understood that polymer (F) will have a MFI determined according to ASTM D 1238 (230° C./5 kg) of advantageously 0.5 to 500 g/10 min, preferably of 1 to 200 g/10 min, more preferably of 2 to 10 g/10 min.

As said, the latex of the invention comprises particles of polymer (F) possessing a parameter Xc (%), i.e. crystallinity order parameter, such to satisfy the aforementioned inequalities.

From a technical standpoint, this crystallinity order parameter is a measure of the structural and conformational order of the ferroelectric phase, the higher the Xc parameter, the more structured and ordered being the ferroelectric crystalline phase.

As a consequence, polymer (F) from the latexes of the invention are such to possess improved ferroelectric performances, as derived from the ferroelectric crystalline phase, the higher the structural order, the better the ferroelectric performances, over polymers from latexes which may be manufactured using the techniques of the prior art.

The method for making a latex as above detailed comprises polymerizing vinylidene fluoride (VDF), trifluoroethylene (TrFE), and optionally at least one additional monomer different from VDF and TrFE in an aqueous emulsion in the presence of a radical initiator and of a fluorinated surfactant [surfactant (C)] complying with formula (I):

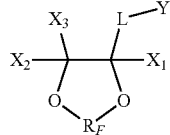
(I)

as above detailed.

In said formula (I), the anionic function Y is preferably selected from the group consisting of those of formulae:

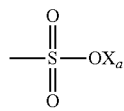
(1″)

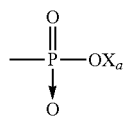
(2″)

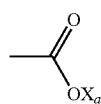
(3″)

wherein $X_a$ is H, a monovalent metal (preferably an alkaline metal) or an ammonium group of formula $N(R'dn)_4$, wherein $R'_n$, equal or different at each occurrence, represents a hydrogen atom or a $C_{1-6}$ hydrocarbon group (preferably an alkyl group).

Most preferably, hydrophilic function Y is a carboxylate of formula (3″), as above detailed.

According to a first embodiment of the invention, the cyclic fluorocompound complies with formula (II) here below:

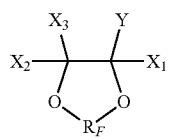
(II)

wherein $X_1$, $X_2$, $X_3$, Y and $R_F$ have the same meaning as above defined.

More preferably, the cyclic fluorocompound complies with formula (III) here below:

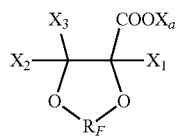
(III)

wherein $R_F$, $X_1$, $X_2$, $X_3$, and $X_a$ have the same meaning as above defined.

According to a second embodiment of the invention, the cyclic fluorocompound complies with formula (IV) here below:

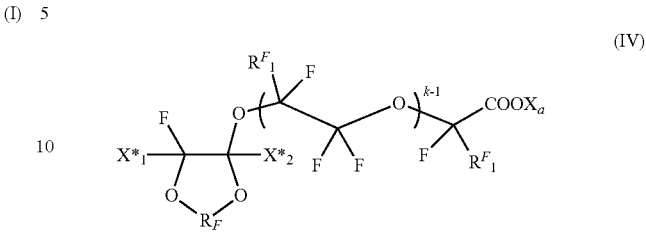
(IV)

wherein $R^F$ and $X_a$ have the same meanings as above detailed; $X^*_1$, $X^*_2$ equal or different each other are independently a fluorine atom, —$R'_f$ or —$OR'_f$, wherein $R'_f$ is a $C_{1-3}$ perfluoroalkyl group; $R^F_1$ is F or $CF_3$, k is an integer from 1 to 3.

Among these compounds, cyclic fluorocompound of formula (V), sketched here below:

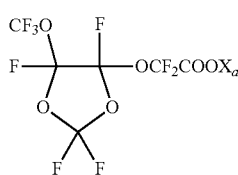
(V)

wherein $X_a$ has the meaning above defined, and in particular with $X_a$ being $NH_4$, has been found particularly useful in the process of the invention.

Polymerization pressure is thus generally comprised between 10 and 40 bars, preferably between 15 and 35 bars, more preferably between 20 and 35 bars.

The skilled in the art will choose the polymerization temperature having regards, inter alia, of the radical initiator used. Polymerization temperature is generally selected in the range 60 to 120° C., preferably 75 to 120° C.

While the choice of the radical initiator is not particularly limited, it is understood that those suitable for the process according to the invention are selected among compounds capable of initiating and/or accelerating the polymerization.

Those skilled in this art will be familiar with a number of initiators that are suitable for the process of the invention.

Organic radical initiators can be used and include, but are not limited to, the following: acetylcyclohexanesulfonyl peroxide; diacetylperoxydicarbonate; dialkylperoxydicarbonates such as diethylperoxydicarbonate, dicyclohexylperoxydicarbonate, di-2-ethylhexylperoxydicarbonate; tert-butylperneodecanoate; 2,2′-azobis(4-methoxy-2,4dimethylvaleronitrile; tert-butylperpivalate; dioctanoylperoxide; dilauroyl-peroxide; 2,2′-azobis (2,4-dimethylvaleronitrile); tert-butylazo-2-cyanobutane; dibenzoylperoxide; tert-butyl-per-2ethylhexanoate; tert-butylpermaleate; 2,2′-azobis(isobutyronitrile); bis(tert-butylperoxy) cyclohexane; tert-butyl-peroxyisopropylcarbonate; tert-butylperacetate; 2,2′-bis (tert-butylperoxy)butane; dicumyl peroxide; di-tert-amyl peroxide; di-tert-butyl peroxide; p-methane hydroperoxide; pinane hydroperoxide; cumene hydroperoxide; and tert-butyl hydroperoxide. Other suitable initiators include halogenated free radical initiators such as chlorocarbon based and fluorocarbon based acyl peroxides such as trichloroacetyl peroxide, bis(perfluoro-2-propoxy propionyl) peroxide, $[CF_3CF_2CF_2OCF(CF_3)COO]_2$, perfluoropropionyl peroxides, $(CF_3CF_2CF_2COO)_2$, $(CF_3CF_2COO)_2$, $\{(CF_3CF_2CF_2)—[CF(CF_3)CF_2O]m-CF(CF_3)—COO\}_2$ where m=0-8, $[ClCF_2(CF_2)_nCOO]_2$, and $[HCF_2(CF_2)_nCOO]_2$ where n=0-8; perfluoroalkyl azo compounds such as perfluoroazoisopropane, $[(CF_3)_2CFN=]_2$, $R^\alpha N=NR^\alpha$, where $R^\alpha$ is a linear or branched perfluorocarbon group having 1-8 carbons; stable or hindered perfluoroalkane radicals such as hexafluoropropylene trimer radical, $[(CF_3)_2CF]_2(CF_2CF_2)C$. radical and perfluoroalkanes.

Redox systems, comprising at least two components forming a redox couple, such as dimethylaniline-benzoyl peroxide, diethylaniline-benzoyl peroxide and diphenylamine-benzoyl peroxide can also be used to initiate the polymerization.

Also, inorganic radical initiators can be used and include, but are not limited to, the followings: persulfates, like sodium, potassium or ammonium persulfates, permanganates, like potassium permanganate.

Inorganic radical initiators, as those above detailed, are preferred.

The radical initiator is included in a concentration ranging advantageously from 0.001 to 20 percent by weight of the polymerization medium.

Polymerization can be carried out in the presence of a chain transfer agent. The chain transfer agent is selected from those known in the polymerization of fluorinated monomers, such as for instance: ketones, esters, ethers or aliphatic alcohols having from 3 to 10 carbon atoms, such as acetone, ethylacetate, diethylether, methyl-ter-butyl ether, isopropyl alcohol, etc.; chloro(fluoro)carbons, optionally containing hydrogen, having from 1 to 6 carbon atoms, such as chloroform, trichlorofluoromethane; bis(alkyl)carbonates wherein the alkyl has from 1 to 5 carbon atoms, such as bis(ethyl)carbonate, bis(isobutyl)carbonate. The chain transfer agent can be fed to the polymerization medium at the beginning, continuously or in discrete amounts (step-wise) during the polymerization, continuous or stepwise feeding being preferred.

The invention also pertains to the use of polymer (F) as above described as ferroelectric, piezoelectric, dielectric or pyroelectric material in electric/electronic devices.

Non limitative examples of said devices are notably transducers, sensors, actuators, ferroelectric memories, capacitors.

The polymer (F) is generally comprised in said devices under the form of substantially bidimensional parts (e.g. films or sheets).

Said films or sheets can be manufactured according to standard techniques, as extrusion, injection moulding, compression moulding and solvent casting.

Said bidimensional articles can be further submitted to post-processing treatment, in particular for enhancing ferroelectric, piezoelectric, dielectric or pyroelectric behaviour, e.g. annealing, stretching, bi-orientation and the like.

Bidimensional articles can be notably submitted to an high poling electric field obtained by polarization cycles for adjusting, in real time via high voltage and data acquisition computer controlled system, polarization, residual polarization and maximum displacement current measured at the coercive field. An embodiment of this process is described in ISNER-BROM, P., et al. Intrinsic Piezoelectric Characterization of PVDF copolymers: determination of elastic constants. *Ferroelectrics*. 1995, vol. 171, p. 271-279., in BAUER, F., et al. Very high pressure behaviour of precisely-poled PVDF. *Ferroelectrics*. 1995, vol. 171, p. 95-102. and in U.S. Pat. No. 4,611,260 (DEUTSCH FRANZ FORSCH INST (FR)) Sep. 9, 1986 and U.S. Pat. No. 4,684,337 (DEUTSCH FRANZ FORSCH INST (FR)) Aug. 4, 1987, whose disclosures are incorporated herein by reference.

Should the disclosure of any patents, patent applications, and publications which are incorporated herein by reference conflict with the description of the present application to the extent that it may render a term unclear, the present description shall take precedence.

The invention will be now explained in more detail with reference to the following examples, whose purpose is merely illustrative and not intended to limit the scope of the invention.

Emulsion polymerization examples in the presence of cyclic surfactant of formula (V) ($X_a$=$NH_4$) and radical initiator (according to the invention) method 11

Example 1—Copolymer VDF-TrFE 70/30 (Molar Ratio)

In an AISI 316 steel vertical autoclave equipped with baffles, and stirrer working at 570 rpm, 3.5 l of demineralized water were introduced. Then the temperature was brought to reaction temperature of 85° C.; once this reached, 50 g of a solution at 34% wt/wt of cyclic surfactant of formula (V), as above detailed, with $X_a$=$NH_4$, in distilled water, and VDF in an amount so as to reach a pressure of 6.9 abs bars were introduced. Next, a gaseous mixture of VDF-TrFE in a molar nominal ratio of 70/30 was added via a compressor, until reaching a pressure of 30 abs bars. The composition of the gaseous mixture present in the autoclave head was analyzed by G.C. At polymerization inception, the gaseous phase was found to be composed of: 75.9% moles VDF, 24.1% moles TrFE. Then, 50 ml of solution of sodium persulphate (NaPS) in demineralized water at a concentration of 3% in volume were fed. The polymerization pressure was maintained constant by feeding the above mentioned VDF-TrFE mixture; when 500 g of the mixture were fed, the feeding mixture was interrupted and while keeping constant the reaction temperature, the pressure was left to fall down up to 15 abs bars. Then the reactor was cooled at room temperature, the latex was discharged, freezed for 48 hours and once unfreezed, the coagulated polymer was washed with demineralized water and dried at 80° C. for 48 hours.

Example 5—Copolymer VDF-TrFE 79/21 (Molar Ratio)

Same procedure as in Ex. 1 was followed, but introducing first 7.75 abs bars of VDF, and supplementing with a gaseous mixture of VDF-TrFE in a molar nominal ratio of 79/21 until reaching set-point pressure of 30 abs bars, providing for overall initial composition: 80.9% moles VDF, 19.1% moles TrFE, and continuing feeding of the said mixture for maintaining set-point pressure.

Example 6—Copolymer VDF-TrFE 80/20 (Molar Ratio)

Same procedure as in Ex. 1 was followed, but introducing first 7.8 absolute bars of VDF and supplementing with a gaseous mixture of VDF-TrFE in a molar nominal ratio of 80/20 until reaching set-point pressure of 30 abs bars, providing for overall initial composition: 81.9% moles VDF, 18.1% moles TrFE, and continuing feeding of the said mixture for maintaining set-point pressure.

Example 8—Copolymer VDF-TrFE 75/25 (Molar Ratio)

Same procedure as in Ex. 1 was followed, but introducing first 6.9 absolute bars of VDF and supplementing with a gaseous mixture of VDF-TrFE in a molar nominal ratio of 75/25 until reaching set-point pressure of 30 abs bars, and continuing feeding of the said mixture for maintaining set-point pressure.

Emulsion Polymerization Examples in the Presence of PFPE Surfactant and Organic Initiator (of Comparison) Method CM1

Example 2C—Copolymer VDF-TrFE 70/30 (Molar Ratio)

In an AISI 316 steel vertical autoclave equipped with baffles, and stirrer working at 570 rpm, 3.5 litres of demineralized water were introduced. The temperature was raised to reaction temperature of 120° C., and once reached, 32.5 g of a micro-emulsion prepared according to EXAMPLE 1 of U.S. Pat. No. 7,122,608 (SOLVAY SOLEXIS S.P.A.), and VDF in an amount so as to reach a pressure of 6.9 abs bars were introduced. Next, a gaseous mixture of VDF-TrFE in a molar nominal ratio of 70/30 was added via a compressor, until reaching set-point pressure of 30 abs bars. At polymerization inception, the gaseous phase was found by GC analysis to be composed of: 77.7% moles VDF, 22.3% moles TrFE. Then by a metering, 22 cc of pure di-tertbutyl peroxide (DTBP) were introduced, and set-point pressure was maintained constant by feeding the above mentioned VDF-TrFE mixture; when 2% of the mixture (on targeted 288 g) were fed, temperature was lowered to 105° C. Monomers' feeding was interrupted once 288 g were fed, and while maintaining temperature, pressure was left to fall down to 15 abs bars. The reactor was cooled at room temperature, the latex was discharged, freezed for 48 hours and once unfreezed, the coagulated polymer was washed with demineralized water and dried at 80° C. for 48 hours.

Example 3C—Copolymer VDF-TrFE-AA 69.5/30/0.5 (Molar Ratio)

Same procedure as in Ex. 2C was followed, but supplementing with a gaseous mixture of VDF-TrFE in a molar nominal ratio of 70/30 until reaching set-point pressure of 30 abs bars, providing for overall initial composition: 76.1% moles VDF, 23.9% moles TrFE, feeding 19 ml of DTBP in combination with an initial amount equal to 4 ml of an aqueous solution of acrylic acid at 2.5 v/v concentration, and pursuing polymerization by step-wise feeding amounts of 4 ml of an aqueous solution of acrylic acid at 2.5 v/v concentration every 29 g of monomers' mixture consumption, while continuing feeding the said VDF-TrFE mixture for maintaining set-point pressure, as detailed in Ex. 2C.

Example 7c—Copolymer VDF-TrFE 80/20 (Molar Ratio)

Same procedure as in Ex. 2C was followed, but introducing first 7.85 absolute bars of VDF and supplementing with a gaseous mixture of VDF-TrFE in a molar nominal ratio of 80/20 until reaching set-point pressure of 30 abs bars, providing for overall initial composition: 86.5% moles VDF, 13.5% moles TrFE, feeding 24 ml of DTBP, and continuing feeding of the said VDF-TrFE mixture for maintaining set-point pressure.

Example 9c—Copolymer VDF-TrFE-AA 74.55/25/0.5 (Molar Ratio)

Same procedure as in Ex. 2C was followed, but introducing first 7.35 absolute bars of VDF and supplementing with a gaseous mixture of VDF-TrFE in a molar nominal ratio of 75/25 until reaching set-point pressure of 30 abs bars, providing for overall initial composition: 82.5% moles VDF, 17.5% moles TrFE, feeding 30 ml of DTBP in combination with 4 ml of same acrylic acid solution described above, and continuing feeding of the said VDF-TrFE mixture for maintaining set-point pressure, and said acrylic acid solution, as detailed in Ex. 3C.

Example 11c—Copolymer VDF-TrFE 75/25 (Molar Ratio)

Same procedure as in Ex. 2C was followed, but introducing first 7.35 absolute bars of VDF and supplementing with a gaseous mixture of VDF-TrFE in a molar nominal ratio of 75/25 until reaching set-point pressure of 30 abs bars, providing for overall initial composition: 82.5% moles VDF, 17.5% moles TrFE, feeding 27 ml of DTBP and continuing feeding of the said VDF-TrFE mixture for maintaining set-point pressure.

Emulsion Polymerization Examples in the Presence of PFPE Surfactant and Inorganic Initiator (of Comparison) Method CM2

Example 10c—Copolymer VDF-TrFE 75/25 (Molar Ratio)

In an AISI 316 steel vertical autoclave equipped with baffles, and stirrer working at 570 rpm, 3.5l of demineralized water was introduced. The temperature was raised to reaction temperature of 85° C., and once reached, 32.5 g of a micro-emulsion prepared according to EXAMPLE 1 of U.S. Pat. No. 7,122,608 (SOLVAY SOLEXIS S.P.A.), 7.35 absolute bars of vinylidene fluoride were introduced. A gaseous mixture of VDF-TrFE in a molar nominal ratio of 75/25 was added through a compressor until reaching set-point pressure of 30 abs bars. The gaseous phase was found by GC to be made of: 82.2% moles VDF, 17.8% moles TrFE. Then through a metering system, 60 ml of an aqueous solution (1% wt) of ammonium persulphate was introduced. The polymerization pressure was maintained constant by feeding the above mentioned monomeric mixture; when 2% of the mixture (on targeted 288 g) were fed, the temperature was lowered to 105° C. Once 288 g of the mixture were fed, feeding was interrupted and while keeping constant temperature, the pressure was left to fall down to 15 abs bars. The reactor was cooled at room temperature, the latex was discharged, freezed for 48 hours, and once unfreezed the coagulated polymer was washed with demineralized water and dried at 80° C. for 48 hours.

Suspension Polymerization Example (of Comparison) Method CM3

Example 4C—Copolymer VDF-TrFE 70/30 (Molar Ratio)

In an AISI 316 steel vertical autoclave, and stirrer working at 880 rpm, 1406 g of demineralized water were introduced. Once temperature of 14° C. reached, 664 g of VDF, 358 g of TrFE, and 713 g of an aqueous Ca(OH)$_2$ solution having a concentration of a concentration of 0.12% w/w, 26.5 g of an aqueous solution of Bermocoll® E230G having a concentration of 20 g/kg, 3.11 g of of a solution of diethylperoxidicarbonate, prepared as described in Example 1 of U.S. Pat. No. 6,255,520 (SOLVAY SA) Jul. 3, 2001, and 8.3 g of diethylenecarbonate were introduced. Next, temperature was raised to 40° C. reaching a pressure of 80 abs bars. The reaction was pursued at 40° C. until the pressure decreased to 44 abs bars, then temperature raised to 55° C., and kept at this set-point until pressure dropped to 29 abs bars; the temperature was again raised up to 60° C., and maintained at this set-point until pressure dropped to 8 abs bars. At this point, reactor was cooled at room temperature, and discharged. The obtained polymer was washed with demineralized water and dried at 100° C. for 16 hours.

Example 12C—Copolymer VDF-TrFE 75/25 (Molar Ratio)

Same procedure as in Ex. 4C was followed but initially charging 767 g of VDF and 255 g of TrFE, and pursuing in last step at 60° C. polymerization until pressure dropped to 7 abs bars.

Monomers' composition and basic properties of the polymers obtained are summarized in the tables herein below.

TABLE 4

| Run | Polymerization method | Monomers' composition (in % moles) | | |
|---|---|---|---|---|
| | | VDF | TrFE | AA |
| Ex. 1 | Method I1 | 70 | 30 | 0 |
| Ex. 2c | Method CM1 | 70 | 30 | 0 |
| Ex. 3c | Method CM1 | 69.5 | 30 | 0.5 |
| Ex. 4c | Method CM3 | 70 | 30 | 0 |
| Ex. 5 | Method I1 | 79 | 21 | 0 |
| Ex. 6 | Method I1 | 80 | 20 | 0 |
| Ex. 7c | Method CM1 | 80 | 20 | 0 |
| Ex. 8 | Method I1 | 75 | 25 | 0 |
| Ex. 9c | Method CM1 | 74.5 | 25 | 0.5 |
| Ex. 10c | Method CM2 | 75 | 25 | 0 |
| Ex. 11c | Method CM1 | 75 | 25 | 0 |
| Ex. 12c | Method CM3 | 75 | 25 | 0 |

TABLE 5

| Run | $T_c$ (° C.)[*] | $\Delta H_c$ (J/g)[*] | $T_m$ (° C.)[*] | $\Delta H_m$ (J/g)[*] | Xc (%)[§] | Mw[#] |
|---|---|---|---|---|---|---|
| Ex. 1 | 102 | 21.46 | 147 | 25.09 | 46.10 | 395 000 |
| Ex. 2c | 95 | 15.12 | 144 | 22.67 | 40.01 | 380 000 |
| Ex. 3c | 96 | 15.75 | 143 | 22.91 | 40.74 | 320 000 |
| Ex. 4c | 110 | 23.01 | 151 | 25.20 | 47.73 | 400 000 |
| Ex. 5 | 131 | 34.94 | 146 | 20.61 | 62.90 | 380 000 |
| Ex. 6 | 132 | 32.67 | 145 | 20.98 | 60.90 | 560 000 |
| Ex. 7c | 131 | 26.47 | 145 | 26.28 | 52.00 | 400 000 |
| Ex. 8 | 116 | 26.01 | 147 | 26.54 | 49.50 | 390 000 |
| Ex. 9c | 110 | 21.68 | 143 | 25.61 | 45.84 | 410 000 |
| Ex. 10c | 114 | 21.09 | 146 | 24.36 | 46.40 | 370 000 |
| Ex. 11c | 111 | 23.58 | 144 | 29.21 | 44.67 | 400 000 |
| Ex. 12c | 118 | 25.38 | 150 | 28.43 | 47.17 | 430 000 |

[*]$T_c$, $\Delta H_c$, $T_m$ and $\Delta H_m$ are, respectively, the Curie transition temperature, the enthalpy associated to the Curie transition, the melting temperature and the enthalpy of melting, as determined by differential scanning calorimetry according to ASTM D3418 and ASTM D3418.

[§]Xc is the parameter: $Xc\ (\%) = \dfrac{\Delta H_c}{(\Delta H_m + \Delta H_c)} \times 100$

[#]Mw is the weight averaged molecular weight, as determined by GPC against polystyrene standards, using dimethylacetamide as solvent.

Determination of Thermal Properties (j) Determination of Curie Transition Temperature ($T_C$) and Enthalpy Associated to the Curie Transition ($\Delta H_c$).

The $T_c$ or Curie transition temperature represents the temperature at which the transition between ferroelectric and paraelectric phase occurs in a ferroelectric material. It is determined as the first endothermic peak appearing in the DSC thermogram during the second heating cycle, otherwise realised pursuant to the ASTM D 3418 standard. The $\Delta H_c$ is the enthalpy associated to this first order transition (Curie transition), as determined in the second heating cycle of the DSC thermogram, as above detailed, applying, mutatis mutandis, indications contained in ASTM D 3418 standard to the first endothermic peak appearing in said second heating cycle. The DSC analyses were performed using a Perkin Elmer Diamond DSC instrument, adopting a ramp rate of 10° C./min in second heating cycle, as prescribed in ASTM D 1238.

(jj) Determination of Enthalpy of Melting ($\Delta H_m$) and Melting Temperature ($T_m$)

The enthalpy of melting (AHm) and melting temperature (Tm) are determined by differential scanning calorimetry (DSC), pursuant to ASTM D 3418, using a Perkin Elmer Diamond DSC instrument.

Determination of Piezoelectric Properties (i) Preparation of Films

Solutions in methylethylketone having concentration of 20% w/w of the polymers were prepared, and films casted by doctor blade technique, using an Elcometer automatic film applicator, model 4380, onto a glass substrate.

The polymer layers so casted were dried at 100° C. for 2 hours under vacuum. On so obtained dried films, by inkjet printing technique, 12 patterns of 1 cm×1 cm were printed as electrodes on both sides of the polymeric film using as conductive material a poly(3,4-ethylenedioxythiophene) polystyrene sulfonate (PEDOT:PSS) purchased by Agfa-Gevaert under the trademark name ORGACON®. The thickness of the samples was measured using a Mitutoyo micrometer.

(ii) Annealing of Films

The films obtained as above detailed were placed in a vented oven set at an inner temperature 135° C. After one hour the oven was switched off and cooled for 5 hours, until reaching room temperature.

(iii) Poling of Films

A LC Precision poling equipment combined with a High Volate Interface with 10 KV maximum field generated, by RADIANT was used for poling the films. The annealed films were placed in the polarization cell where field of 150 V/microns or 200 V/microns was applied trough the annealed film specimens.

(iv) Determination of Piezoelectric Coefficient (d33)

The value of the piezoelectric coefficient (d33) was measured using a PIEZOMETER PM300 instrument, placing the poled sample obtained as described above in the instrument strain gouge where the film was stimulated under a vibration at 110 Hz at room temperature. The d33 is reported as μC/N.

(v) Determination of Leakage at 100 V/βm

Leakage refers to a gradual loss of energy from a charged capacitor. Determination of leakage is performed in the polarization cell applying 100 V/microns on the electrodes of the capacitor and determining the said loss in energy after 5 seconds.

(vi) Determination of Dielectric Permittivity of the Films

The value of dielectric permittivity [k] was derived from the direct measurement of dielectric capacitance by a piezo meter system provided by Piezotest. The capacitance values were all measured at 110 Hz.

$$\text{Dielectric permittivity}[k] = \frac{\text{Capacitance}[F] \times \text{Thickness}[m]}{\varepsilon_0[F/m] \times \text{Area}[m^2]}$$

(vi) Ferroelectric Hysteresis Measurements ($P_r$, $P_{max}$)

The hysteresis determination was performed by submitting the annealed film to poling in a field from 80 V/microns to 250 V/microns, obtaining an hysteresis curve were the maximum polarization, and residual polarization were measured. The $P_{max}$ is the maximum polarization achievable with the maximum field applied, the $P_r$ is the residual polarization (also referred to as remnant polarization) in the samples after the removal of the applied field.

Results are summarized in the Table below:

TABLE 4

| | poling | leakage 100 V/μm | [k] | $P_r$ | $P_{max}$ | d33 (pC/N) |
|---|---|---|---|---|---|---|
| Ex. 1 | no | 4.0 × 10e−7 | 10.1 | | | <0.1 |
| | 150 V/μm | 2.2 × 10e−7 | 9.8 | 6.7 | 8.7 | 20.7 |
| | 200 V/μm | 1.9 × 10e−7 | 9.2 | | | 22.5 |
| Ex. 2C | no | 7.3 × 10e−7 | 8.4 | | | <0.1 |
| | 150 V/μm | 4.2 × 10e−7 | 8.5 | 6.4 | 7.6 | 18.7 |
| | 200 V/μm | 2.9 × 10e−7 | 7.7 | | | 20.8 |
| Ex. 3C | no | 6.3 × 10e−7 | 8.8 | | | <0.1 |
| | 150 V/μm | 3.3 × 10e−7 | 8.3 | 6.2 | 7.9 | 20.2 |
| | 200 V/μm | 2.3 × 10e−7 | 7.9 | | | 21.9 |
| Ex. 4C | no | 2.5 × 10e−7 | 8.1 | | | <0.1 |
| | 150 V/μm | 1.5 × 10e−7 | 6.7 | 6.8 | 8.3 | 22.2 |
| | 200 V/μm | 1.1 × 10e−7 | 9.4 | | | 23.1 |
| Ex. 5 | no | 8.4 × 10e−9 | 9.9 | | | <0.1 |
| | 150 V/μm | 6.6 × 10e−9 | 9.4 | 6.9 | 8.4 | 21 |
| | 200 V/μm | 3.6 × 10e−9 | 9.1 | 7.4 | 9.1 | 25.9 |
| Ex. 6 | no | 8.9 × 10e−9 | 10.5 | | | <0.1 |
| | 150 V/μm | 8.6 × 10e−9 | 9.8 | 7.3 | 8.6 | 22.3 |
| | 200 V/μm | 7.6 × 10e−9 | 9.3 | 8.2 | 9.7 | 25.2 |
| Ex. 7c | no | 3.3 × 10e−7 | 8.2 | | | <0.1 |
| | 150 V/μm | 1.9 × 10e−7 | 6.9 | 5.6 | 7.2 | 16.9 |
| | 200 V/μm | 1.3 × 10e−7 | 7.1 | | | 19.9 |
| Ex. 8 | no | 3.2 × 10e−7 | 10.7 | | | <0.1 |
| | 150 V/μm | 3.4 × 10e−7 | 10 | 7.5 | 9.5 | 21.1 |
| | 200 V/μm | 1.6 × 10e−7 | 9.7 | | | 21.4 |
| Ex. 9C | no | 3.4 × 10e−7 | 10.2 | | | <0.1 |
| | 150 V/μm | 2.6 × 10e−7 | 8.8 | 6.1 | 8.1 | 17.9 |
| | 200 V/μm | 1.5 × 10e−7 | 8.3 | | | 20 |
| Ex. 10C | no | 4.8 × 10e−7 | 10 | | | <0.1 |
| | 150 V/μm | 2.9 × 10e−7 | 8.7 | 6.0 | 7.8 | 18 |
| | 200 V/μm | 1.9 × 10e−7 | 8.2 | | | 20 |
| Ex. 11C | no | 6.2 × 10e−7 | 9.8 | | | <0.1 |
| | 150 V/μm | 3.1 × 10e−7 | 8.3 | 5.8 | 7.4 | 17.2 |
| | 200 V/μm | 3.8 × 10e−7 | 7.8 | | | 19.6 |

TABLE 4-continued

| | poling | leakage 100 V/μm | [k] | $P_r$ | $P_{max}$ | d33 (pC/N) |
|---|---|---|---|---|---|---|
| Ex. 12C | no | 2.2 × 10e−7 | 8.6 | | | <0.1 |
| | 150 V/μm | 1.6 × 10e−7 | 6.9 | 6.7 | 8.3 | 20.8 |
| | 200 V/μm | 1.2 × 10e−7 | 5.2 | | | 21.8 |

To the sake of meaningful comparisons, data collected in Table 4 are ordered so as to provide immediate comparison between groups of VDF-TrFE copolymers possessing substantially similar monomers' composition, but differing because of the method of making the same.

So, when comparing piezoelectric properties of VDF/TrFE copolymers having substantially 70/30 mol/mol composition (See Ex. 1; 2c; (3c); 4c), wherein Ex. 1 is a copolymer obtained from a latex according to the invention, 2c and 3c are obtained from latexes polymerized in the presence of an alternative surfactant, not delivering the claimed ordered crystalline structure; and Ex. 4c is a copolymer from suspension polymerization, a higher remnant polarization value ($P_r$) is achieved for Ex. 1 with respect to Ex. 2c and 3c, approaching values obtained with suspension-polymerized 4c.

Indeed, the remnant polarization ($P_r$) is the parameter that identifies the capability of the material to keep oriented its crystals after poling and is one of the most significant measurable properties for measuring piezoelectric performances.

Similarly, comparison between performances of Ex. 5 and 6 (from latexes according to the invention, polymerized in the presence of the cyclic compound) and Ex. 7c, of similar composition, but obtained from a latex polymerized in the presence of an alternative surfactant, not delivering the hereby claimed structural order in the crystalline phase, demonstrate the effectiveness in providing higher $P_r$, higher $P_{max}$ and higher $d_{33}$ values.

Same conclusion can be again drawn when considering performances of Ex. 8, obtained from the latex according to the invention, over those of Ex. 10c, 11c (from emulsion-polymerized latex not according to the invention) and Ex. 12c (from suspension-polymerized material): in this case, for the 75/25 mol/mol composition, the remnant polarization value $P_r$ and the $d_{33}$ value achieved with the polymer resulting from the latex according to the invention are superior not only to the performances achieved with other emulsion-polymerized copolymers, but also over those achieved through suspension polymerization.

The invention claimed is:

1. An aqueous latex comprising particles of a polymer (F), wherein polymer (F) comprises:

recurring units derived from vinylidene fluoride (VDF) in an amount of at least 60% moles and of at most 81% moles, with respect to the total moles of recurring units;

recurring units trifluoroethylene (TrFE) in an amount of at least 18% moles and of at most 39% moles, with respect to the total moles of recurring units, and optionally recurring units derived from at least one additional monomer different from VDF and TrFE in an amount of 0 to 5% moles, said polymer (F) possessing thermodynamic ordered structure in the ferroelectric phase, such that the relation between:

(i) the parameter Xc (%) defined as follows:

$$Xc\ (\%) = \frac{\Delta H_c}{(\Delta H_m + \Delta H_c)} \times 100$$

wherein $\Delta H_c$ is the enthalpy associated to the Curie transition between ferroelectric and paraelectric phase, as determined in J/g by DSC technique on second heating scan, at a ramp rate of 10° C., and $\Delta H_m$, is the enthalpy of melting, as determined in J/g according to ASTM D3418; and (ii) the content of recurring units different from VDF expressed in % moles, with respect to the total moles of recurring units, designated as CM (% moles), satisfies the following inequality: Xc (%)≥a·CM (% moles)+b wherein a=−1.10 and b=75.00; and wherein the polymer (F) is obtained via polymerization in the presence of a fluorinated surfactant (C), wherein surfactant (C) complies with formula (I):

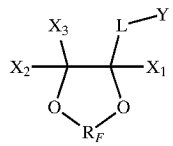
(I)

wherein $X_1$, $X_2$, $X_3$, equal or different from each other are independently selected from H, F, and $C_{1-6}$ (per)fluoroalkyl groups, optionally comprising one or more catenary or non-catenary oxygen atoms; L represents a bond or a divalent group; $R_F$ is a divalent fluorinated $C_{1-3}$ bridging group; and Y is an anionic functionality.

2. The aqueous latex of claim 1, wherein polymer (F) comprises recurring units derived from one or more than one fluoromonomers other than VDF and TrFE or recurring units derived from one or more than one non-fluorinated monomers.

3. The aqueous latex of claim 1, wherein polymer (F) comprises:
recurring units trifluoroethylene (TrFE) in an amount of from 20% to 35% moles, with respect to the total moles of recurring units.

4. The aqueous latex of claim 1, wherein polymer (F) consists essentially of recurring units derived from VDF and TrFE.

5. The aqueous latex of claim 1, wherein the melt flow index (MFI) of polymer (F), as determined according to ASTM D 1238 (230° C./5 kg), is of 0.5 to 500 g/10 min.

6. The aqueous latex of claim 4, wherein polymer (F) consists essentially of:
from 18 to 35% by moles of recurring units derived from TrFE; and
from 68 to 80% moles.

7. The aqueous latex of claim 5, wherein the melt flow index (MFI) of polymer (F), as determined according to ASTM D 1238 (230° C./5 kg), is of 2 to 10 g/10 min.

* * * * *